(12) United States Patent
Tomiha et al.

(10) Patent No.: US 10,408,897 B2
(45) Date of Patent: Sep. 10, 2019

(54) MAGNETIC RESONANCE IMAGING APPARATUS

(71) Applicant: Toshiba Medical Systems Corporation, Otawara-shi (JP)

(72) Inventors: Sadanori Tomiha, Nasushiobara (JP); Satoshi Imai, Nasushiobara (JP)

(73) Assignee: Canon Medical Systems Corporation, Otawara-shi (JP)

( * ) Notice: Subject to any disclaimer, the term of this patent is extended or adjusted under 35 U.S.C. 154(b) by 190 days.

(21) Appl. No.: 15/627,582

(22) Filed: Jun. 20, 2017

(65) Prior Publication Data

US 2018/0003783 A1 Jan. 4, 2018

(30) Foreign Application Priority Data

Jun. 30, 2016 (JP) .................................. 2016-130265
Jun. 13, 2017 (JP) .................................. 2017-115702

(51) Int. Cl.

| G01R 33/36 | (2006.01) |
| G01R 33/50 | (2006.01) |
| G01R 33/34 | (2006.01) |
| G01R 33/58 | (2006.01) |

(52) U.S. Cl.
CPC ... G01R 33/3685 (2013.01); G01R 33/34046 (2013.01); G01R 33/50 (2013.01); G01R 33/58 (2013.01)

(58) Field of Classification Search
CPC combination set(s) only.
See application file for complete search history.

(56) References Cited

U.S. PATENT DOCUMENTS

2011/0267062 A1* 11/2011 Otake ................ G01R 33/3685
                                                                324/322
2013/0249560 A1*  9/2013 Okamoto ........... G01R 33/3664
                                                                324/322

FOREIGN PATENT DOCUMENTS

JP          7-124135 A        5/1995

* cited by examiner

*Primary Examiner* — Jay Patidar
(74) *Attorney, Agent, or Firm* — Oblon, McClelland, Maier & Neustadt, L.L.P.

(57) ABSTRACT

According to one embodiment, a magnetic resonance imaging apparatus includes a first transmit coil transmitting a first RF pulse corresponding to a resonance frequency of a first nuclide species in an object placed in an imaging space, a first receive coil receiving a first NMR signal of the first nuclide species, a cable connected to the first receive coil, a balun attached to the cable and/or the first receive coil, a substance attached to the balun and/or a vicinity of the balun, the substance including a second nuclide species having a resonance frequency different from the resonance frequency of the first nuclide species, a second transmit coil transmitting a second RF pulse corresponding to a resonance frequency of the second nuclide species, and a second receive coil receiving a second NMR signal of the second nuclide species in the substance.

14 Claims, 12 Drawing Sheets

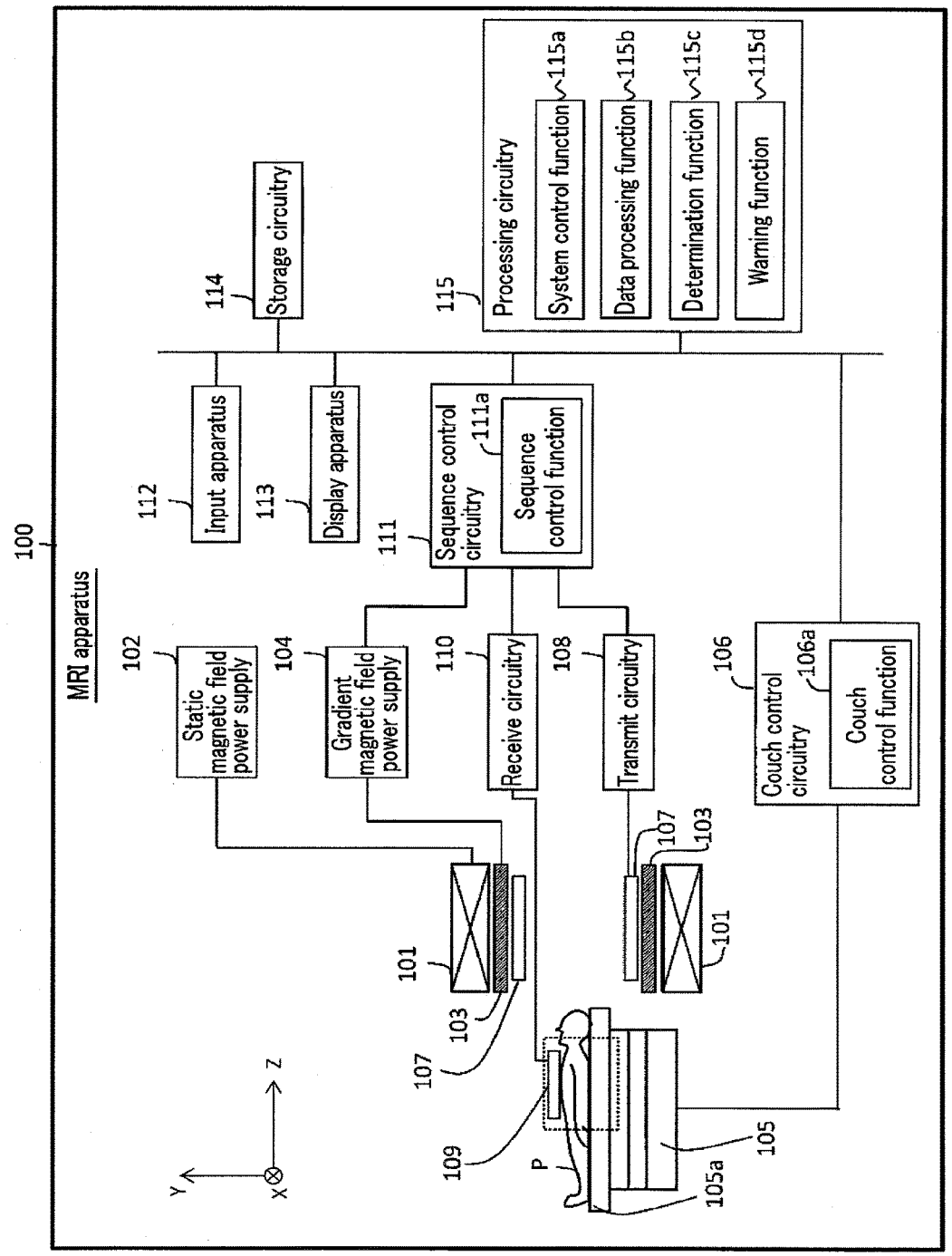
F I G. 1

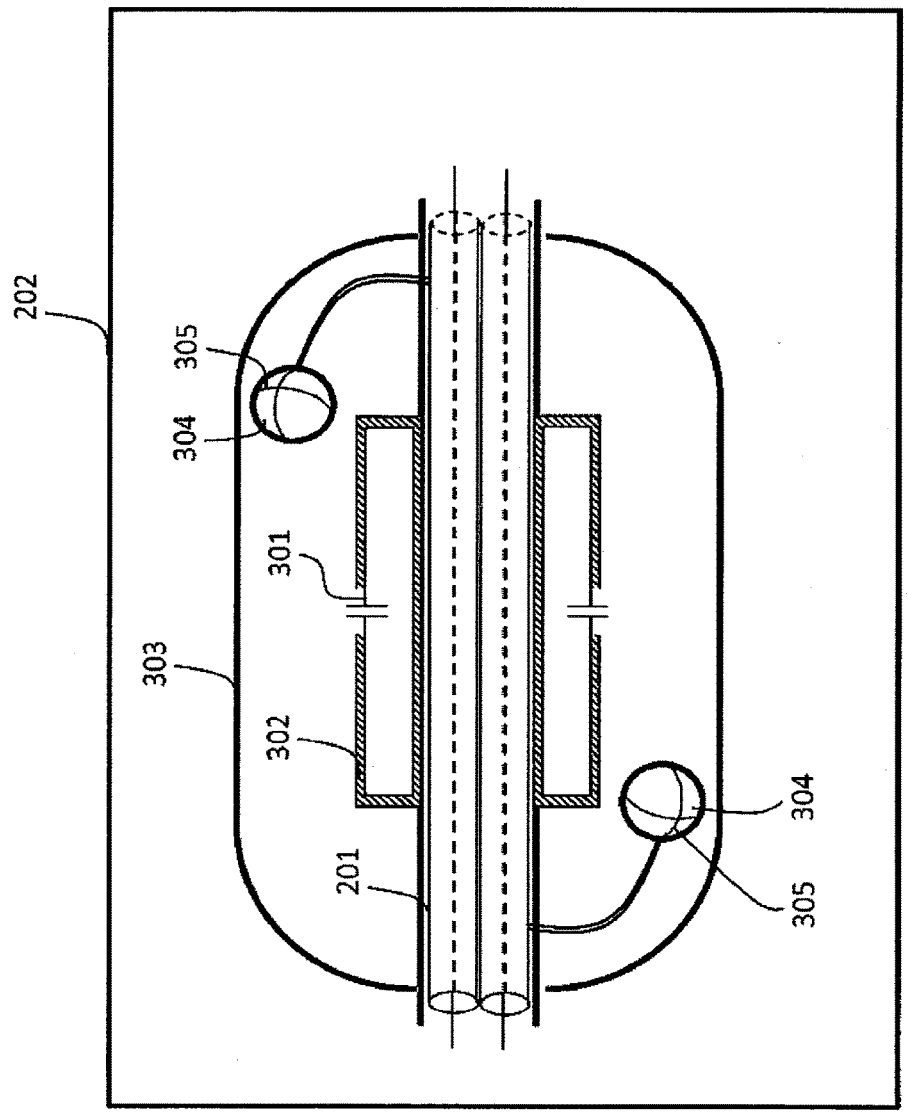
F I G. 6

MAGNETIC RESONANCE IMAGING APPARATUS

CROSS-REFERENCE TO RELATED APPLICATIONS

This application is based upon and claims the benefit of priority from the prior Japanese Patent Applications No. 2016-130265, filed Jun. 30, 2016, and No. 2017-115702, filed Jun. 13, 2017, the entire contents of all of which are incorporated herein by reference.

FIELD

The present embodiment relates to a magnetic resonance imaging apparatus.

BACKGROUND

In magnetic resonance imaging, atomic nucleus spins of an object positioned in a static magnetic field are magnetically excited with an RF (radio frequency) pulse at a Larmor frequency. Magnetic resonance imaging is an imaging method to generate an image from data of nuclear magnetic resonance (NMR) signals generated as a consequence of the excitation.

When an examination using a magnetic resonance imaging apparatus ("MRI apparatus" hereinafter) is conducted, a receive coil for receiving NMR signals from protons is attached to an object. The receive coil is connected to the MRI apparatus via a cable. If the cable and the receive coil get too close to a bore having an approximately cylindrical shape, an unbalanced current flows in the cable and the receive coil. At this time, the cable and the receive coil may generate heat and short-circuit.

To prevent an unbalanced current from flowing in the cable and the receive coil, a balance-unbalance converter ("balun" hereinafter) may be attached to the cable or the receive coil. A balun absorbs an unbalanced current by its resonance circuitry to prevent the unbalanced current from flowing in the cable and the receive coil. However, if a balun gets too close to the side wall of the bore of the MRI apparatus, an unbalanced current flowing in the balun will increase, and the balun may generate heat.

BRIEF DESCRIPTION OF THE DRAWINGS

FIG. 1 is a block diagram schematically showing a configuration of a magnetic resonance imaging apparatus according to an embodiment.

FIG. 6 is an explanatory drawing showing an example of the structure inside of a balun case according to the embodiment.

DETAILED DESCRIPTION

Figure 2:
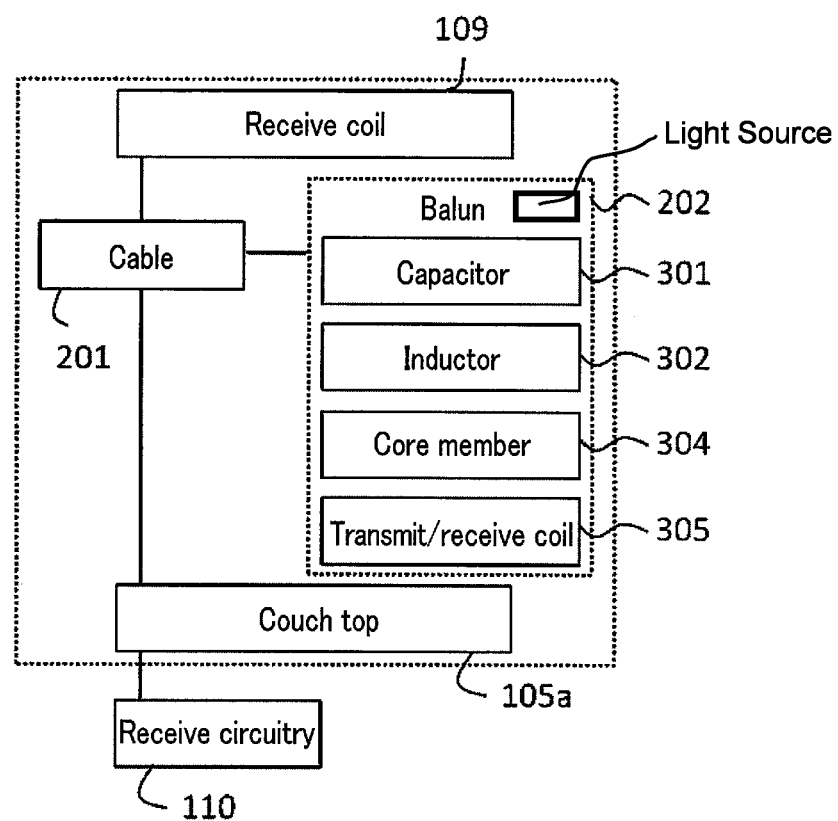
FIG. 2 is a block diagram showing a configuration of the magnetic resonance imaging apparatus according to the embodiment in detail.

In general, according to one embodiment, a magnetic resonance imaging apparatus includes a first transmit coil, a first receive coil, a cable, a balun, a substance, a second transmit coil, and a second receive coil. The first transmit coil transmits a first RF pulse corresponding to a resonance frequency of a first nuclide species in an object positioned in the imaging space. The first receive coil receives the first NMR signal of the first nuclide species. The cable is connected to the receive coil. The balun is attached to at least one of the cable and the receive coil. The substance is attached to at least one of the balun and the vicinity of the balun. The substance includes a second nuclide species having a resonance frequency different from the resonance frequency of the first nuclide species. The second transmit coil transmits a second RF pulse corresponding to the resonance frequency of the second nuclide species. The second receive coil receives a second NMR signal of the second nuclide species in the substance.

In the following, the magnetic resonance imaging apparatus (hereinafter, the MRI apparatus) according to the embodiment will be described with reference to the drawings.

In the MRI apparatus 100 according to the present embodiment, not only an NMR (nuclear magnetic resonance) signal from protons but also an NMR signal from the substance placed in later-described baluns 202 on a receive coil 109 and on a cable 201 are obtained to obtain position information of the baluns.

(Embodiment)

FIG. 1 is a block diagram showing the configuration of the MRI apparatus according to the embodiment. As shown in FIG. 1, the MRI apparatus 100 includes a static magnetic field magnet 101, a static magnetic power supply 102, a gradient coil 103, a gradient magnetic field power supply 104, a couch apparatus 105, couch control circuitry 106, a transmit coil 107, transmit circuitry 108, a receive coil 109, receive circuitry 110, sequence control circuitry 111, an input apparatus 112, a display apparatus 113, storage circuitry 114, and processing circuitry 115. An object P (for example, a human body) is not included in the MRI apparatus 100. The configuration shown in FIG. 1 is merely an example. For example, the couch control circuitry 106, the sequence control circuitry 111, and the processing circuitry 115 may be integrated or separated as appropriate when being configured. For example, processing circuitry serving the function of each of the couch control circuitry 106, the sequence control circuitry 111, and the processing circuitry 115 may be provided to carry out the present embodiment.

Conversely, the processing circuitry 115 may be divided into four independent processing circuits, and each may be configured to execute each of the system control function 115a, the data processing function 115b, the determining function 115c, and the warning function 115d.

The static magnetic field magnet 101 is a magnet formed in a hollow, approximately cylindrical shape (including a shape whose cross section orthogonal to the central axis of a cylinder has an elliptic shape), and generates a static magnetic field in its inner space. In the description of the embodiment hereinafter, a hollow, approximately cylindrical shape includes a shape whose cross section orthogonal to the central axis of a cylinder has an elliptic shape. The static magnetic field magnet 101 is, for example, a superconductive magnet, and is excited when a current is supplied from the static magnetic field power supply 102. The static magnetic field power supply 102 is a power-supplying apparatus that supplies a current to the static magnetic field magnet 101. A permanent magnet may be used as the static magnetic field magnet 101. In this case, the MRI apparatus 100 does not need to have a static magnetic field power supply 102. The static magnetic field power supply 102 may be provided separately from the MRI apparatus 100.

The gradient coil 103 is a hollow, approximately cylindrical-shaped coil, and it is placed inside the static magnetic field magnet 101. The gradient coil 103 is formed by combining three coils respectively corresponding to the X-, Y-, and Z-axes which are orthogonal to each other. These three coils are separately supplied with a current from the gradient magnetic field power supply 104 and respectively generate gradient magnetic fields in which magnetic field intensity changes along each of the X-, Y-, and Z-axes. The gradient magnetic fields in the X-, Y-, and Z-axes generated by the gradient coil 103 are a gradient magnetic field Gs for slice encoding, a gradient magnetic field Ge for phase encoding, and a gradient magnetic field Gr for read encoding, for example. The gradient magnetic field power supply 104 is a power supply apparatus that supplies a current to the gradient coil 103.

The couch apparatus 105 includes a couch top 105a on which the object P is placed, an unillustrated base, and an unillustrated couch driving apparatus. The base is a housing that has a motor or an actuator that can move the couch top 105a in the up-and-down direction (the direction orthogonal to the body axis direction of the object P) by the couch driving apparatus. The couch driving apparatus is a motor or an actuator that inserts the couch top 105a on which the object P is placed into and out of the approximately cylindrical-shaped bore 20 provided in the MRI apparatus 100. The couch top 105a is a plate-shaped member on which the object P is placed and which is movable in the direction of the body axis of the object P and in the direction orthogonal to the body axis by the couch driving apparatus. The couch apparatus 105 is an example of a couch unit.

The couch control circuitry 106 has a couch control function 106a (a couch control unit). For example, the couch control circuitry 106 is realized by a processor. The couch control circuitry 106 that realizes the couch control function 106a is connected to the couch apparatus 105, and controls the operation of the couch apparatus 105 by outputting electric signals for control to the couch apparatus 105. For example, the couch control function 106a receives an instruction to move the couch top 105a in the longitudinal direction, the up-and-down direction, or the left-to-right direction, from an operator via the input apparatus 112, and operates the driving mechanism of the couch top 105a of the couch apparatus 105, so that the couch top 105a is moved in accordance with the received instruction signal. The couch control circuitry 106 is an example of a first processing unit, and the couch control function 106a is an example of a couch control unit.

The transmit coil 107 is a coil having a hollow, approximately cylindrical shape, and it is placed inside the gradient coil 103. The transmit coil 107 generates a high frequency magnetic field when RF (Radio Frequency) is supplied from the transmit circuitry 108. The transmit coil 107 is an example of a first transmit coil. The first transmit coil 107 transmits a first RF pulse corresponding to a resonance frequency of a first nuclide species in the object P placed in the imaging space in the frame apparatus, which is the main body of the MRI apparatus 100. A first nuclide species is, for example, protons. The first transmit coil 107 is, for example, a whole-body coil covering the imaging space.

The transmit circuitry 108 is electric circuitry that supplies the transmit coil with an RF pulse corresponding to a resonance frequency (Larmor frequency) that is determined in accordance with a type of targeted atom and intensity of a magnetic field generated by the static magnetic field magnet 101. In the present embodiment, the transmit coil 107 has a function of transmitting an RF pulse to excite energy state of protons included in the object and to generate an NMR signal from the protons. The transmit circuitry 108 is an example of a transmit unit.

The receive coil 109 is placed inside of the gradient coil 103, and it is a coil for receiving an NMR signal from protons emitted from the object P by the influence of the high RF magnetic field. When the receive coil 109 receives an NMR signal from protons in the object P, the receive coil 109 outputs the received NMR signal to the receive circuitry 110. The receive coil 109 and the circuitry configuration thereof will be described in detail later with reference to FIGS. 2 and 4. The receive coil 109 is an example of a first receive coil. The first receive coil 109 receives a first NMR signal of a first nuclide species.

The receive circuitry 110 detects an NMR signal that is output from the receive coil 109, and generates MR data from the detected NMR signal. More specifically, the receive circuitry 110 carries out digital conversion on the NMR signal that is output from the receive coil 109. In the present embodiment, both of an NMR signal of protons and an NMR signal of the core member 304 for imaging the object P are transmitted in a digitized state to the sequence control circuitry 111. The receive circuitry 110 is an example of a receive unit.

The sequence control circuitry 111 has a sequence control function 111a (a sequence control unit). For example, the sequence control circuitry 111 is realized by a processor. The sequence control circuitry ill that realizes the sequence control function 111a executes a variety of pulse sequences. Specifically, the sequence control circuitry 111 that realizes the sequence control function 111a drives the gradient magnetic field power supply 104, the transmit circuitry 108, and the receive circuitry 110 by reading sequence execution data that is output from the processing circuitry 115 to execute a variety of pulse sequences. The sequence control circuitry 111 is an example of a second processing unit, and the sequence control function 111a is an example of a sequence control unit.

Herein, the sequence execution data is information defining a pulse sequence which indicates a set of procedures for collecting MR data. Specifically, the sequence execution data is information that defines timing when the gradient magnetic field power supply 104 supplies a current to the gradient coil 103 and magnitude of the supplied current, magnitude of a RF pulse current supplied to the transmit coil 107 by the transmit circuitry 108 and timing of the supply, and detection timing when the receive circuitry 110 detects an MR signal.

The sequence control circuitry 111 that realizes the sequence control function 111a, receives the digitized NMR signals of protons and of the core member 304 from the receive circuitry 110 as a result of executing the variety of pulse sequences. The sequence control circuitry 111 stores the received NMR signals of protons and of the core member 304 in the storage circuitry 114.

The input apparatus 112 receives various instructions and information inputs from an operator. The input apparatus 112 is, for example, a pointing device, such as a mouse and a track ball, a selector device, such as a mode switch, etc., or an input device, such as a keyboard, etc. The input apparatus 112 may use a GUI (graphical user interface). The input apparatus 112 is an example of an input unit.

Under the control of the system control function 115a of the processing circuitry 115, the display apparatus 113 displays a GUI for receiving inputs of imaging conditions, and images generated by the data processing function 115b of the processing circuitry 115, and so on. The display apparatus 113 is, for example, a liquid crystal display. The display apparatus 113 also has a function of displaying a later-described warning. The display apparatus 113 may be provided on the base device side which is a main body of the MRI apparatus 100, or may be provided on a console device side which operates the MRI apparatus 100 and in a room separated from the base device. The display apparatus 113 is an example of a display unit.

The storage circuitry 114 stores different types of data. For example, the storage circuitry 114 may be realized by a semiconductor memory element, such as a RAM (Random Access Memory) and a flash memory, a hard disk, and an optical disk, etc. The storage circuitry 114 receives and stores the digitized NMR signals of protons and of the core member 304 via the sequence control circuitry 111 and the receive circuitry 110. The storage circuitry 114 also stores a predetermined threshold related to the later-described $T_2^*$ value. The storage circuitry 114 is an example of a storage unit.

The processing circuitry 115 consists of the processing circuitry 115a, the data processing function 115b, the determination function 115c, and the warning function 115d. For example, the processing circuitry 115 is realized by a processor. The processing circuitry 115 is an example of a third processing unit.

The processing circuitry 115 that realizes the system control function 115a controls the components and functions of the MRI apparatus 100 to achieve total control of the MRI apparatus 100. For example, the system control function 115a receives inputs of various parameters related to a pulse sequence from the operator via the input apparatus 112, and reads the received parameters to generate sequence execution data. Thereafter, the system control function 115a transmits the generated sequence execution data to the sequence control circuitry 111 to carry out the various pulse sequences. The system control function 115a is an example of a system control unit.

The processing circuitry 115 that realizes the data processing function 115b reads the digitized NMR signal of protons (the first NMR signal) from the storage circuitry 114, and carries out post-processing, that is, reconstruction processing, such as a Fourier transformation, on the NMR signal of protons to generate spectrum data or image data of desired nuclear spins in the object P. The data processing function 115b reads the digitized NMR signal of the core member 304 (the second NMR signal) from the storage circuitry 114 to calculate a $T_2^*$ value based on the NMR signal of the core member 304, and outputs the value to the determination function 115c. The $T_2^*$ value will be described later in detail with reference to FIG. 9. The data processing function 115b is an example of a data processing unit.

The processing circuitry 115 that realizes the determination function 115c receives a $T_2^*$ value that is output from the core member 304 from the data processing function 115b, and determines whether or not the $T_2^*$ value is below a predetermined threshold. The determination function 115c is an example of a determination unit.

Herein, it is possible to predetermine a threshold value of the $T_2^*$ value in advance by conducting an experiment. For example, when installing each MRI apparatus 100, the substance that outputs an NMR signal that is equivalent to the NMR signal from the core member 304 is placed in each of predetermined positions in the bore 20 of the MRI apparatus 100. An NMR signal is then received by transmitting an RF pulse to each substance, and a $T_2^*$ value is measured from the NMR signal that is output from the substance at each of the positions in the bore 20. It is thus possible to set a $T_2^*$ value corresponding to a region within a predetermined distance from the side wall of the bore 20 as a threshold for the $T_2^*$ value. Specifically, while the balun 202 is at a predetermined distance from the first transmit coil 107 in the imaging space in the bore 20, the processing circuitry 115 calculates a $T_2^*$ value based on a second NMR signal obtained by transmitting a second RF pulse from the second transmit coil to the substance, and sets the calculated $T_2^*$ value as the above threshold. At this time, the determined threshold for the $T_2^*$ value is stored in the storage circuitry 114, and is used when a comparison is made with a $T_2^*$ value of the substance placed in the balun 202. Since a plurality of baluns 202 are placed in the later-described cable 201 and receive coil 109, the determination function 115c determines whether or not a $T_2^*$ value of a core member 304 placed in each of the plurality of baluns 202 is below a threshold.

If the determination function 115c detects a $T_2^*$ value below a predetermined threshold, the processing circuitry 115 that realizes the warning function 115d (a warning unit) specifies a balun 202 that includes a core member 304 below the threshold among the core members 304 placed in the plurality of baluns 202. For example, the warning function 115d notifies the operator of a warning by displaying warning information on a display screen of the display apparatus 113. The method of making a warning by the warning function 115d is not limited to the above-described method. For example, if the detected $T_2^*$ value is below a predetermined threshold, the processing circuitry 115 may control the circuitry, etc. so as to stop scanning or, if the scanning is at a pause, so as not to begin next scanning. The warning function 115d is an example of a warning unit.

The processing circuitry 115 that realizes the warning function 115d notifies the operator of a warning by flashing or turning on a separately-provided lamp. For example, a light source, such as an LED, etc., may be provided in the balun 202. At this time, the processing circuitry 115 that realizes the warning function 115d detects (determines) only the balun 202 that has gotten close to the side wall of the bore 20 among a plurality of baluns 202, and causes only the light source of the specified balun 202 to emit light to notify the operator that the balun 202 is getting close to the side wall of the bore 20. It is not necessary to attach a light source, such as an LED, to the balun 202 itself, and a light source may be placed in a predetermined position corresponding to the position of the balun 202. For example, a light source may be placed on the surface of the cable 201 in the vicinity of both ends of the balun 202. If the balun 202 is placed in the receive coil 109, a light source may be placed on the later-described cover 204 shown in FIG. 3 in the vicinity of the balun 202. In other words, a light source is capable of lightening or flashing in accordance with a warning, and is provided at a position corresponding to the balun 202. A light source is an example of a light source unit.

The processing circuitry 115 that realizes the warning function 115*d* may notify the operator of a warning by sound. In this case, the MRI apparatus 100 includes a speaker as an additional component, and receives input information from the warning function 115*d* and sends out a warning sound from the speaker to notify the operator that the balun 202 is getting close to the side wall of the bore 20. In other words, the processing circuitry 115 causes the speaker to output a sound corresponding to a warning.

FIG. 2 is a block diagram illustrating the components accompanying the receive coil 109 according to the present embodiment. Since the receive coil 109, the receive circuitry 110, and the couch top 105*a* have already been explained in the foregoing, the explanation thereof is omitted.

The cable 201 is used when transmitting an NMR signal obtained by the receive coil 109 to the receive circuitry 110, and is configured by a coaxial cable. One end of the cable 201 is connected to the receive coil 109. The other end of the cable 201 is connected to the later-described connector 203 of the cable 201 and is connected to the receive circuitry 110 via the couch top 105*a*.

A balun 202 (balance-unbalance converter) is connected to the cable 201. The balun 202 is a device for suppressing an unbalanced current flowing in the cable 201 and the receive coil 109, and is configured by a resonance circuitry having a capacitor 301 and an inductor 302. Specifically, an unbalanced current flowing in the cable 201 and the receive coil 109 is absorbed by the resonance circuitry of the balun 202 to prevent the transmission of such unbalanced current.

The core member 304 is made of, for example, a fluorine compound placed in a predetermined spherical container. When a fluorine compound is used as the core member 304, an NMR signal is output from fluorine atoms when an RF pulse corresponding to a resonance frequency of the fluorine atoms is applied. By using a fluorine compound as the core member 304, it is possible to share transmit circuitry for transmitting an RF pulse to excite fluorine atoms and receive circuitry for receiving an NMR signal from fluorine atoms with each of the transmit circuitry 108 and the receive circuitry 110 of the MRI apparatus 100. In other words, under the same static magnetic field, the sensitivity ratio of fluorine to the sensitivity of protons is approximately 0.83, and the sensitivity of fluorine is close to that of protons. Thus, the sharing can be realized by a simple structure for changing a resonance frequency of an RF pulse for protons and modulating the pulse to an RF pulse for fluorine. The core member 304 is housed in a spherical container, and the transmit/receive coil 305 is attached so as to surround the spherical container. The core member 304 is, for example, attached to at least either the balun 202 or the vicinity of the balun 202, and is the substance including a second nuclear type having a resonance frequency different from that of a first nuclide species. The core member 304 is an example of a member made of a fluoride compound, etc.

As an element that outputs an NMR signal and constitutes a compound used for the core member 304, an element other than fluoride may be used as long as the element has a resonance frequency different from that of protons. In this case, additional transmit circuitry and receive circuitry that are different from the transmit circuitry 108 and the receive circuitry 110 of the MRI apparatus 100 are used to transmit and receive a signal corresponding to a resonance frequency of the core member 304. The transmit coil 107 according to the present embodiment is used to output an RF pulse corresponding to the resonance frequency of protons. For this reason, it is desirable to configure a transmit coil for transmitting an RF pulse to excite fluorine, separately from the above-described transmit coil 107. Accordingly, in the present embodiment, a transmit/receive coil 305 is additionally provided around the core member 304 in order to transmit an RF pulse corresponding to the resonance frequency of fluorine, and to receive an NMR signal that is output from the core member 304.

The transmit/receive coil 305 is a coil that combines, for example, a function of a transmit coil for transmitting an RF pulse corresponding to a resonance frequency of the core member 304 with a function of a receive coil (a second receive coil) for receiving an NMR signal that is output from fluorine excited by the RF pulse. The transmit/receive coil 305 is connected to the MRI apparatus 100 via the cable 201. The configuration of the transmit/receive coil 305 will be described in detail with reference to FIG. 7. The transmit/receive coil 305 is an example of a core member transmit/receive coil and a second receive coil. In other words, the transmit coil (a second transmit coil) in the transmit/receive coil 305 transmits a second RF pulse corresponding to a resonance frequency of the second nuclide species to the substance corresponding to the core member 304. The receive coil (the second receive coil) in the transmit/receive coil 305 receives, through the second RF pulse, a second NMR signal of the second nuclide species of the substance. The second receive coil includes, for example, three individual loop coils, the three individual loop coils being orthogonal to each other.

The transmit/receive coil 305 is a coil that combines a function of a transmit coil for transmitting an RF pulse corresponding to a resonance frequency of the core member 304 with a function of a receive coil for receiving an NMR signal that is output from the core member 304 excited by the RF pulse. The configuration of the transmit/receive coil 305 will be described later in detail with respect to FIG. 7.

Figure 3:
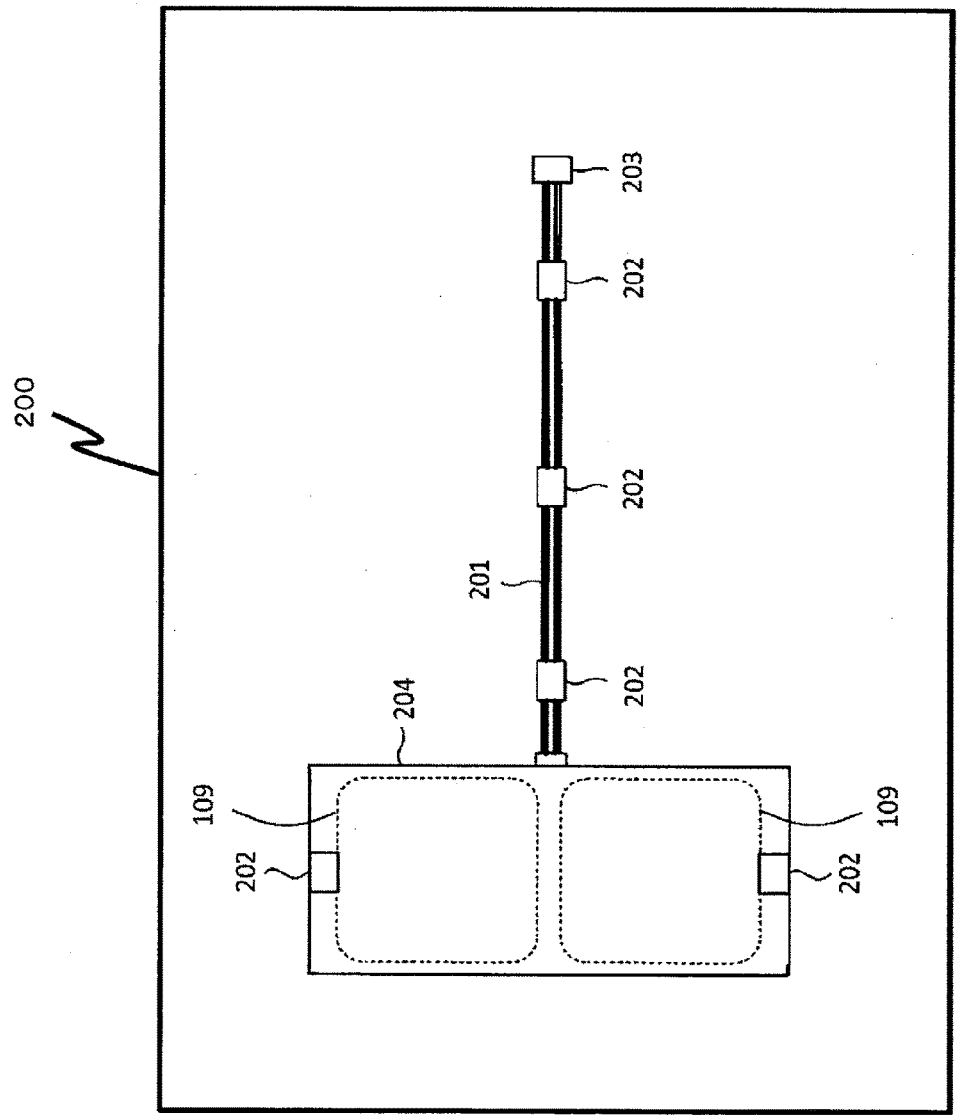
FIG. 3 is an external view showing an example of an outer appearance of a receive coil and a cable according to the embodiment.
Figure 4:
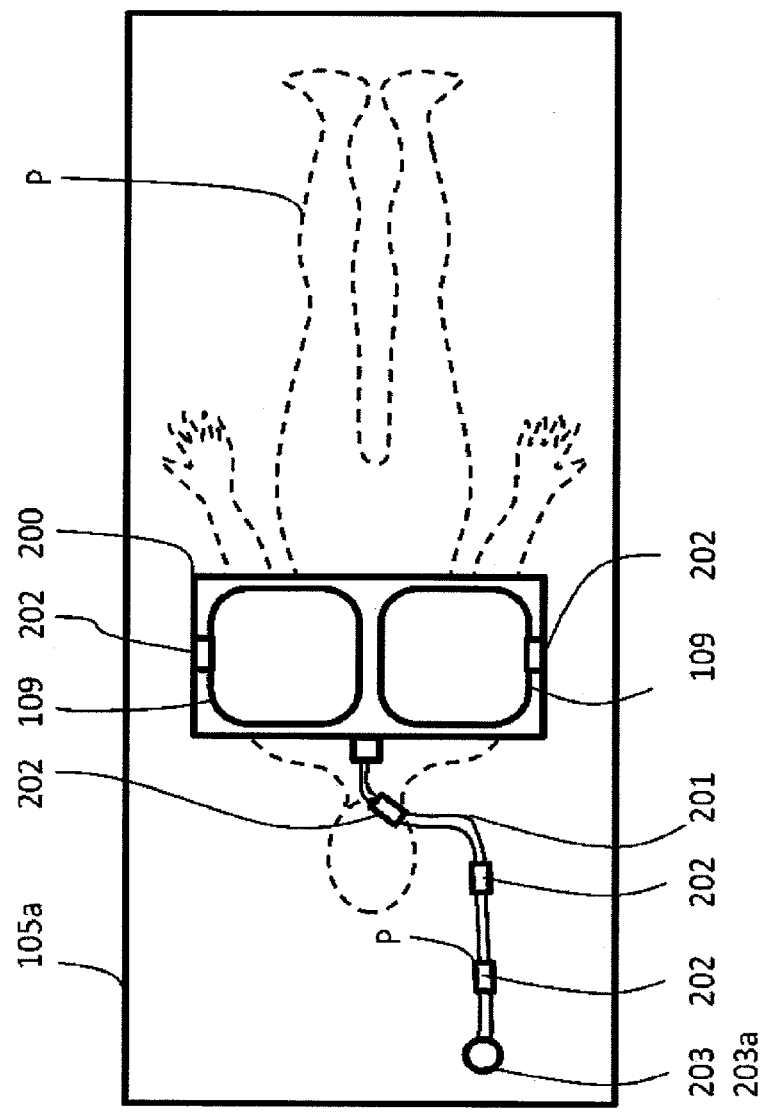
FIG. 4 is a drawing showing an example of how the receive coil is attached to an object according the embodiment.

FIG. 3 is a schematic diagram showing a configuration example of the receive coil unit 200 according to the present embodiment. FIG. 4 is a drawing showing an example of a state where the receive coil unit 200 is attached to the object P lying on their side on the couch top 105*a*.

The receive coil unit 200 at least includes, as shown in FIG. 3, a receive coil 109 for receiving an NMR signal of protons in the object P, a cable 201 for transmitting the NMR signal of protons received by the receive coil 109, and a balun 202.

The receive coil 109 is, for example, a loop coil, as shown in FIG. 3. The receive coil unit 200 illustrated in FIG. 3 has two receive coils 109; however, the number of the receive coils 109 is not limited to two, and it may be 1, or 3 or more. The receive coil 109 is housed in the cover 204, as needed. The receive coil 109 is not limited to a loop coil shown in FIG. 3; a surface coil, a flexible coil, a body coil, a spine coil, or a place-on-top type head coil may be used as the receive coil 109.

An NMR signal received by the receive coil 109 is transmitted to the receive circuitry 110 usually by a coaxial cable. As shown in FIG. 3, if the number of the receive coil 109 is two, the NMR signal is transmitted by two coaxial cables. In this case, the cable 201 may be a bundle of two coaxial cables, or a cable (a composite cable) covered by a conductive shield (exterior conductive material) integrating a plurality of coaxial cables, a bundle of single lines and pair lines. One end of the cable 201 is coupled to the receive coil 109, and the other hand of the cable 201 is connected to the connector 203 of the cable 201. A signal line that is drawn from the transmit/receive coil 305 is included in the cable 201. An RF pulse to excite the core member 304 is transmitted to the transmit/receive coil 305, and the NMR signal of the core member 304 that is obtained by the transmit/receive coil 305 when excitation by the RF pulse occurs is transmitted to the receive circuitry 110.

The connector 203 engages with a connector 203a provided in the couch top 105a as shown in FIG. 4. In other words, the receive coil unit 200 is constituted with the connector 203 and the connector 203a, and detachable from the couch top 105a.

Furthermore, the receive coil unit 200 according to the present embodiment includes baluns 202 at predetermined positions in the cable 2 with respect to the longitudinal direction, and at predetermined positions in the cover 204 of the receive coil 109. In the examples shown in FIG. 3 and FIG. 4, two baluns 202 are provided in the cover 204, and three baluns 303 are provided in the cable 201; however, the number of the baluns 202 is not limited thereto. The baluns 202 according to the present embodiment are provided on the cable 201 and the outer periphery of the cover 204 at the predetermined positions in the cable 201 and the cover 204.

When an RF pulse is transmitted to the imaging space by the transmit coil 107, the transmitted RF pulse is applied to the cable 201 as well as the receive coil 109. At this time, an unbalanced current is generated in the receive coil 109 and the cable 201. An unbalanced current caused by the application of RF pulse indicates a larger value than an unbalanced current generated at the time of receiving an NMR signal; however, such a large unbalanced current is also absorbed by the resonance circuitry of the balun 202. At this time, an unbalanced current is converted into heat mainly by a capacitor of the resonance circuitry of the balun 202, thereby absorbing the unbalanced current. In particular, in the side wall of the bore 20 of the MRI apparatus 100, a distance to the transmit coil 107 is short; as a result, the intensity of an RF pulse that is transmitted from the transmit coil 107 and passes through the balun 202 becomes greater. As a consequence, the unbalanced current flowing in the balun 202 is increased, and more heat is generated compared to when a balun 202 exists in the center of the bore 20.

Figure 5:
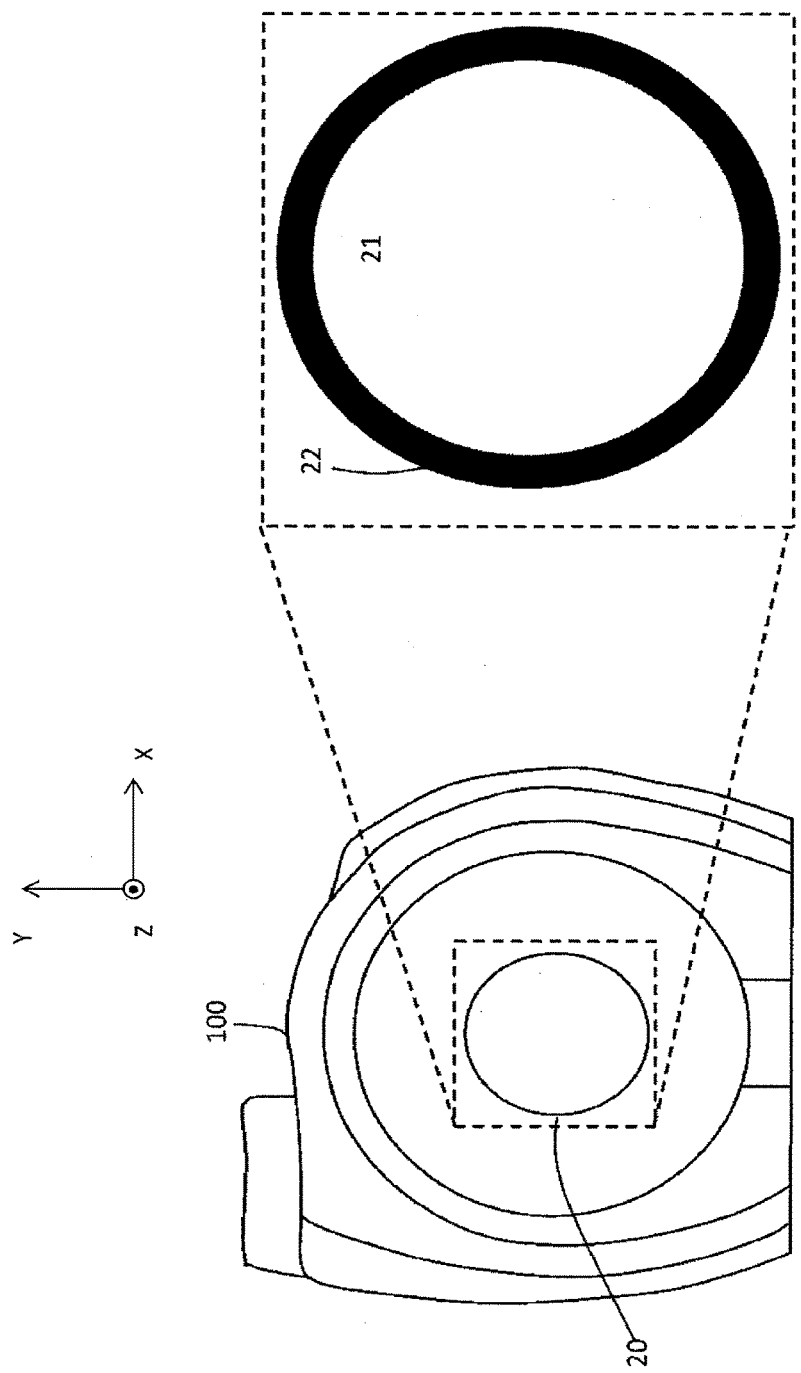
FIG. 5 is an explanatory drawing showing a uniformity of a magnetic field in a bore of the magnetic resonance imaging apparatus according to the embodiment.

FIG. 5 is a drawing schematically showing a distribution of a magnetic field in the bore 20 of the MRI apparatus 100 according to the embodiment. In the bore 20 of the MRI apparatus 100, the uniformity of the magnetic field is high in the vicinity of the center of the bore 20, and the uniformity of the magnetic field is decreased toward the side wall of the bore 20. As shown in FIG. 5, for example, it is possible to divide the bore 20 into a region 21 with high magnetic field uniformity and a region 22 with low magnetic field uniformity. The determination function 115c detects the balun 202 being located in the region 22 where the uniformity of the magnetic field is low, using the later-described $T_2^*$ value. In FIG. 5, the region 21 with high magnetic field uniformity and the region 22 with low magnetic field uniformity are distinguishably illustrated for the sake of explanation. In reality, the distribution of the magnetic field uniformity in the bore 20 is high in the vicinity of the center of the bore 20, and is gradually reduced toward the side wall. In the present embodiment, to prevent the balun 202 from getting too close to the bore 20, a region at a predetermined distance from the side wall of the bore 20 is regarded as a region with low magnetic field uniformity, and a region close to the center of the bore 20 within a predetermined distance from the side wall of the bore 20 is regarded as a region with high magnetic field uniformity.

FIG. 6 is a long axis cross-section view of the balun 202. FIG. 6 also shows the cable 201 as well as the balun 202. The balun 202 has a capacitor 301 and an inductor 302. In the balun 202, a resonance circuitry that resonates at a resonance frequency of an RF pulse is constituted with the capacitor 301 and the inductor 302. The capacitor 301 is provided on the opposite side of the cable 201 with the inductor 302 being interposed therebetween, as shown in FIG. 6. For this reason, if the capacitor 301 generates heat as the balun 202 gets close to the side wall of the bore 20, the outer periphery of the balun 202 in the vicinity of the capacitor 301 becomes hot.

The capacitor 301 and the inductor 302 are placed inside of the balun case 303 as shown in FIG. 6. The balun case 303 is a hollow or solid case made of a resin, etc. In the inside of the balun case 303 according to the present embodiment, the core member 304 and the transmit/receive coil 305 are further placed in addition to the capacitor 301 and the inductor 302.

Figure 7:
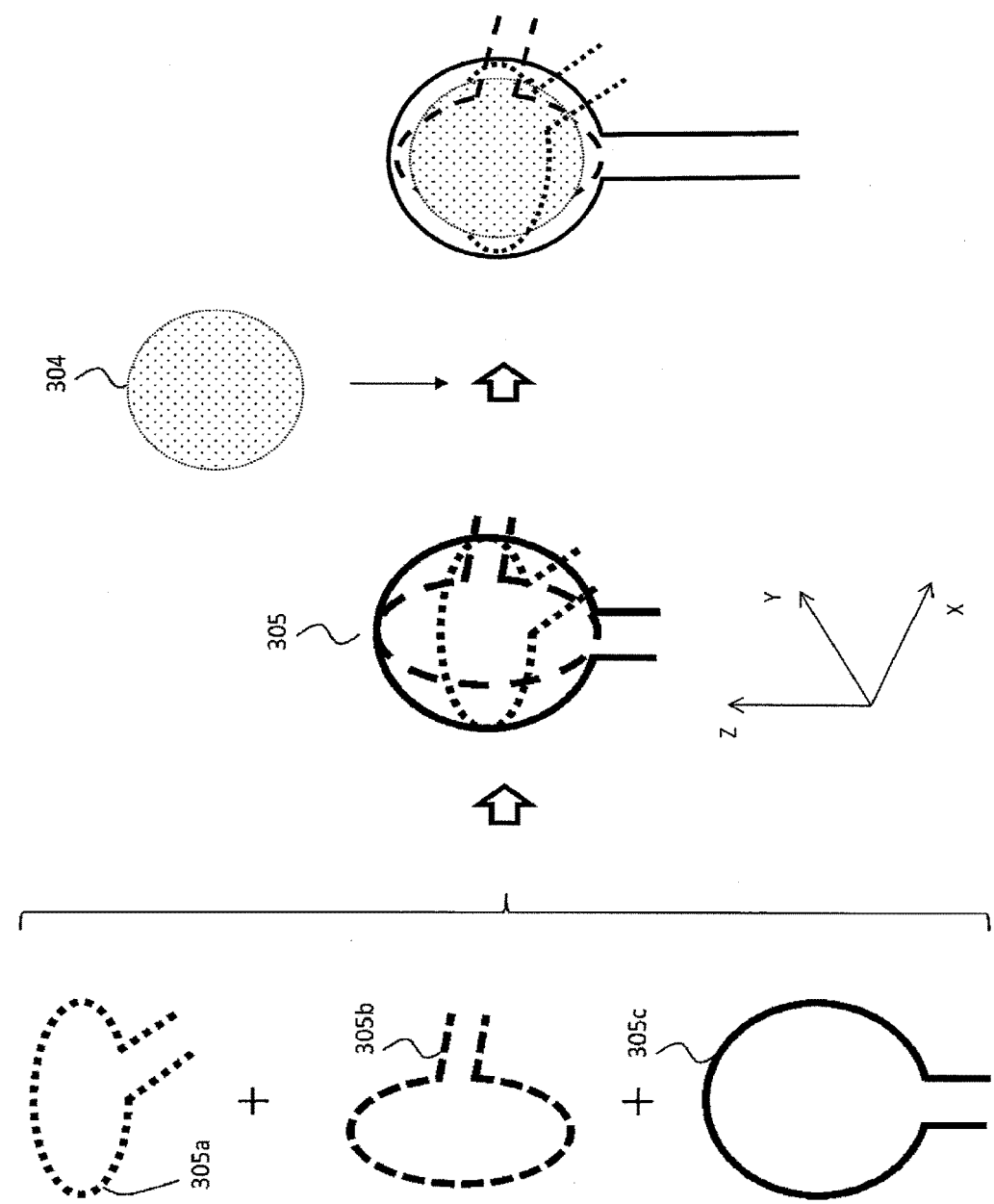
FIG. 7 is an explanatory drawing of an example of a method of arranging a substance that outputs magnetic resonance signals and a transmit/receive coil according to the embodiment.

FIG. 7 is an explanatory drawing explaining the configuration of the transmit/receive coil 305. The positions of the receive coil 109 and the cable 201 are different depending on the position of the object, and may be changed as a result of the body movement of the object. Accordingly, the direction of the transmit/receive coil 305 attached to the receive coil 109 and the cable 201 with respect to the static magnetic field is uncertain, depending on the position and the body movement of the object. On the other hand, when the loop surface of the transmit/receive coil 305 is orthogonal to the direction of the static magnetic field, an NMR signal generated by the core member 304 cannot be received. Accordingly, the transmit/receive coil 305 is comprised of the sub-transmit/receive coils 305a, 305b, and 305c respectively corresponding to three directions that are orthogonal to each other, so that an NMR signal can be detected regardless of the direction of the static magnetic field. The transmit/receive coil 305 is comprised of a combination of the sub-transmit/receive coils 305a, 305b, and 305c. The sub-transmit/receive coils 305a, 305b, and 305c are directed in a mutually-orthogonal manner that enables detection of an NMR signal by the sub transmit/receive coil 305b and the sub-transmit/receive coil 305c, so that even when the loop surface of, for example, the sub transmit/receive coil 305a is orthogonal to the static magnetic field and cannot detect an NMR signal, it is possible to detect an NMR signal by the other sub transmit/receive coils 305b and 305c. In FIG. 7, the wiring of the transmit/receive coil 305 extends in different directions toward the cable 201 for the brevity of illustration; however, it is desirable to draw the wiring from one place and direct it toward the cable 201. The transmit/receive coil 305 is placed so as to surround the core member 304 in which fluorine is housed, as shown in FIG. 7.

There is no need to use all the sub transmit/receive coils 305a, 305b, and 305c when transmitting an RF pulse and receiving an NMR signal. For example, the RF pulse to excite energy state of florine and to generate an NMR signal from the fluorine is transmitted from at least one of the transmit/receive coils 305. It is desired that the number of the sub-transmit/receive coils 305 to be used correspond to each respective three-dimensional direction, as explained above. However, since an NMR signal can be received unless the static magnetic field penetrates the loop of the transmit/receive coil 305, it is also possible to use only the transmit/receive coils 305 corresponding to two directions. Providing a plurality of sub-transmit/receive coils allows obtaining more than one NMR signal. To obtain a later-described $T_2^*$ value, the $T_2^*$ value can be obtained from an NMR signal having a largest amplitude among a plurality of NMR signals, or can be obtained from an average of a plurality of $T_2^*$ value.

When an RF pulse is transmitted from the transmit/receive coil 305 by the MRI apparatus 100, the core member 304 outputs an NMR signal. In the present embodiment, a later-described $T_2^*$ value is obtained from the NMR signal of the core member 304, and the position information of the balun 202 to which the core member 304 is attached in the bore 20 of the MRI apparatus 100 can be known by the $T_2^*$ value.

Figure 8:
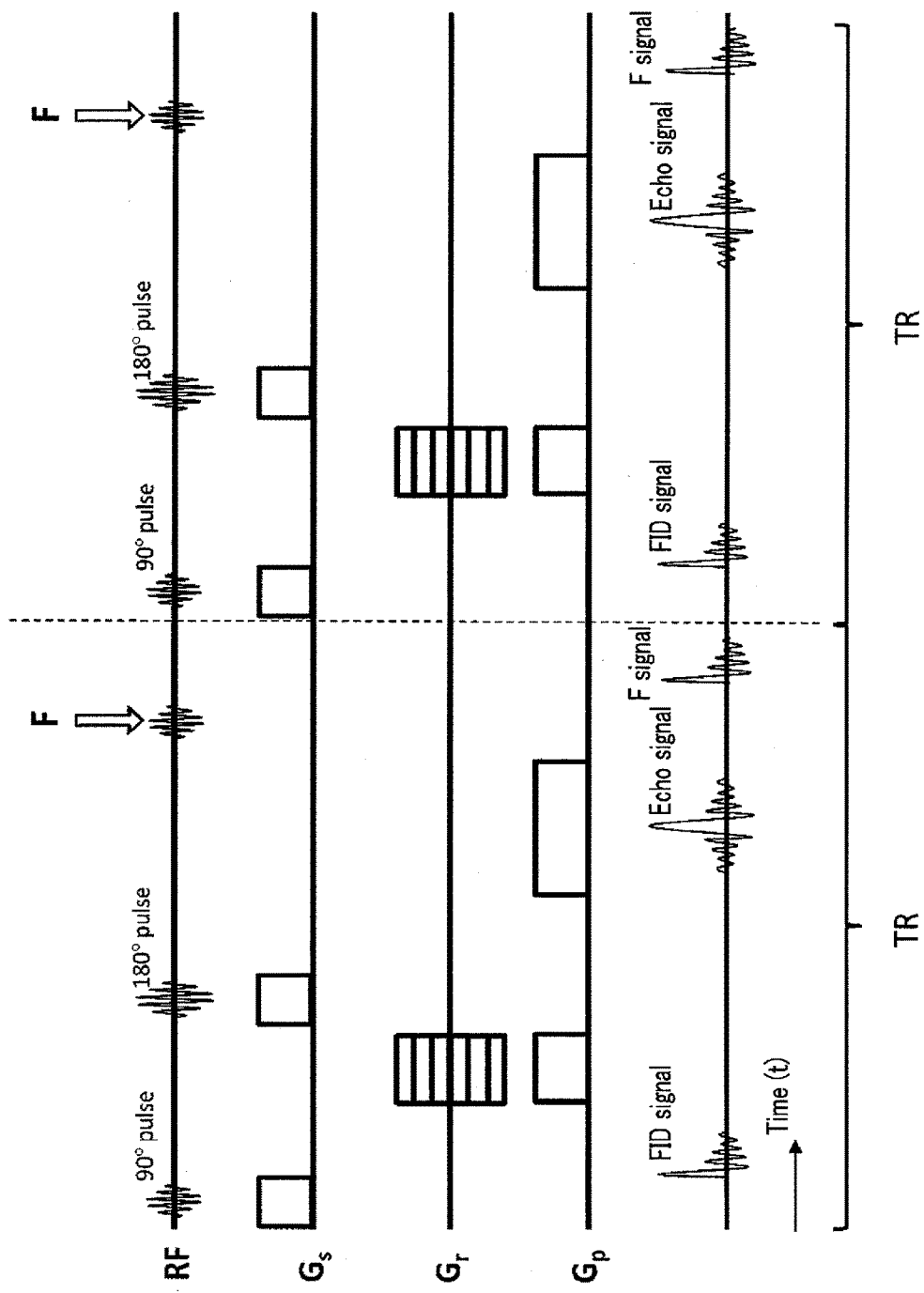
FIG. 8 is a timing chart explaining an example of timing of acquiring NMR signals related to a $T_2^*$ value according to the embodiment.

FIG. 8 is a timing chart showing an example of a pulse sequence for explaining the transmit timing of an RF pulse corresponding to a resonance frequency of a fluorine according to the present embodiment. In FIG. 8, a spin echo method (SE method) is used as an example of a pulse sequence. In FIG. 8, "RF" indicates timing when an RF pulse is applied. In "Gs" in FIG. 8, the horizontal axis indicates timing when a slice gradient magnetic field is applied and a duration of the application, and the vertical axis indicates an intensity of the slice gradient magnetic field. In "Gr" in FIG. 8, the horizontal axis indicates timing when a readout gradient magnetic field is applied and a duration of the application, and the vertical axis indicates an intensity of the readout gradient magnetic field. In "Gp" in FIG. 8, the horizontal axis indicates timing when a phase encode gradient magnetic field is applied and a duration of the application, and the vertical axis indicates an intensity of the phase encode gradient magnetic field.

For example, as shown in FIG. 8, in a pulse sequence according to the SE method in the present embodiment, a 180° pulse is applied after a 90° pulse is applied. By applying the 90° pulse, a free induction decay (FID) signal is generated, and by applying the 180° pulse, an echo signal is generated. An NMR signal of protons in the object P can be obtained from the above FID signal and echo signal. According to the pulse sequence based on the SE method, the same pulse sequence is repeatedly carried out in a cycle of a repetition time (TR). As shown in FIG. 8, in the SE method, there is a timing to which no gradient magnetic field in all directions is applied immediately before the repetition time TR is finished. At this timing indicated by arrow F in FIG. 8, an RF pulse of 90° to excite the core member 304, for example, is transmitted. In other words, the second transmit coil transmits a second RF pulse to the substance in a cycle during which no gradient magnetic field is applied to the substance under the control of the sequence control circuitry 111. The second receive coil receives a second NMR signal during this period. The reason of transmitting an RF pulse to excite atoms included in a core member at timing F when no gradient magnetic field is applied is that if a gradient magnetic field is applied, the distribution of the static magnetic field in the bore 20 becomes inclined along the gradient magnetic field, and a $T_2^*$ value which depends on the magnetic field uniformity becomes a value not reflecting the uniformity of the static magnetic field itself. If an RF pulse of 90° is transmitted to the core member 304 at the aforementioned timing indicated by arrow F, an NMR signal is output from the core member 304, like the one shown as an F signal in FIG. 8. The RF pulse transmitted to the core member 304 is not necessarily limited to the aforementioned RF pulse of 90°.

The RF pulse to excite the core member 304 may be transmitted in every TR, or transmitted at an interval of a certain TR. In FIG. 8, the RF pulse to excite the core member 304 is applied once per every TR in each pulse sequence; however, the RF pulse to excite the core member 304 can be applied several times.

Figure 9:
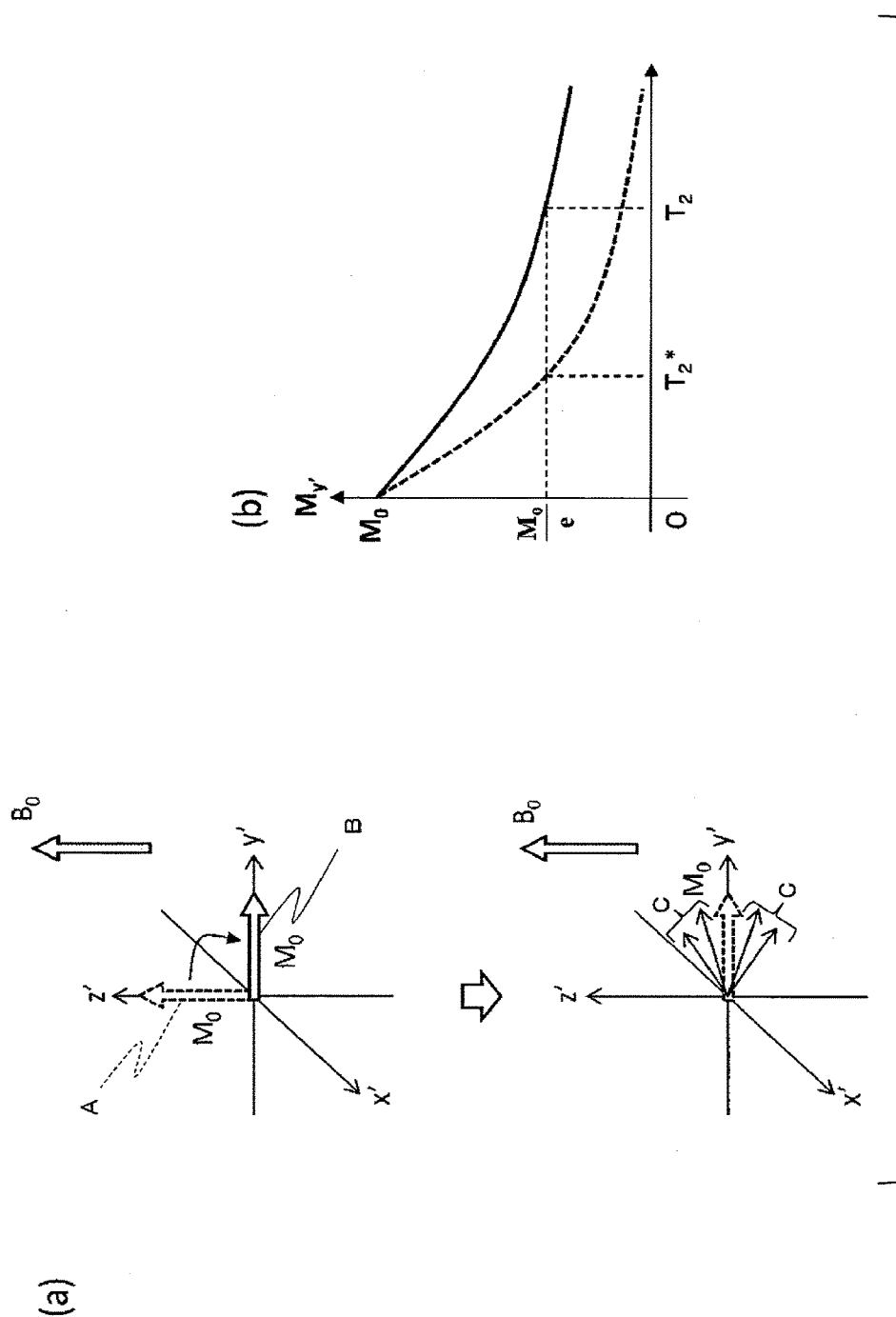
FIG. 9 is an explanatory drawing showing a concept of the $T_2^*$ value according to the embodiment.

FIG. 9 is a schematic diagram to explain a $T_2^*$ value. As an example, suppose a static magnetic field $B_0$ is applied in the z' direction with respect to the magnetization $M_0$ shown in FIG. 9. In this example, an RF pulse of 90° is transmitted to fluorine atoms. At this time, the magnetization $M_0$ performs precession around the z'-axis shown in FIG. 9 (a) (in the direction A shown in FIG. 9 (a)). Next, when a 90° pulse is applied as shown in FIG. 9, the magnetization $M_0$ becomes inclined for 90° with respect to the Z'-axis, and performs precession in the y-axis (in the direction B shown in FIG. 9 (a)). After applying a 90° pulse, each spin in the magnetization $M_0$ fans out in the x'-y' plane (the C direction in FIG. 9 (a)), and the y-axis component $M_y'$ of the magnetization $M_0$ exponentially attenuates. Since $M_y'$ is a vector on the x'-y' plane, this attenuated state is detected as an FID signal as shown in FIG. 8 by a high-frequency current induced by a coil parallel to the x-y plane. The attenuated state of the FID signal is expressed with a time constant $T_2$. As shown in FIG. 9 (b), $T_2$ indicates a time until when an FID signal attenuates to 1/e of a value before the attenuation.

It should be noted that the time constant $T_2$ attenuates earlier in reality, as the time constant $T_2$ is affected by the uniformity of the static magnetic field. The time until when the FID actually attenuates to 1/e by an influence of the non-uniform static magnetic field is $T_2^*$. Accordingly, the more non-uniform the static magnetic field is, the shorter $T_2^*$ becomes. Thus, the $T_2^*$ becomes much shorter in the vicinity of the side wall of the bore 20 of the MRI apparatus 100. This is because a resonance frequency is different depending on a location if a magnetic field is not uniform and the attenuation is encouraged as a phase is dispersed with time. For this reason, a $T_2^*$ value in a case where the core members 304 are placed at positions in the bore 20 is measured in advance, and a relationship between the $T_2^*$ value and a distance from the side wall of the bore 20 is determined in advance. Furthermore, by setting a $T_2^*$ value corresponding to the predetermined distance as a threshold, a range of a predetermined distance from the side wall of the bore 20 can be detected from a $T_2^*$. In other words, the processing circuitry 115 sets a plurality of values as thresholds, the plurality of values being corresponding to the plurality of positions in the imaging space. If the $T_2^*$ value becomes below a preset threshold, the determination function 115c detects that the balun 202 attached to the core member 304 is getting close to the side wall of the bore 20. For example, upon a $T_2^*$ value being smaller than a threshold, the processing circuitry 115 that realizes the determination function 115c determines a position of the balun in the imaging space by using the plurality of values and the $T_2^*$ value smaller than the threshold. At this time, the processing circuitry 115 that realizes the warning function 115d outputs information as a warning to the display apparatus 113 in accordance with the position of the balun.

Figure 10:
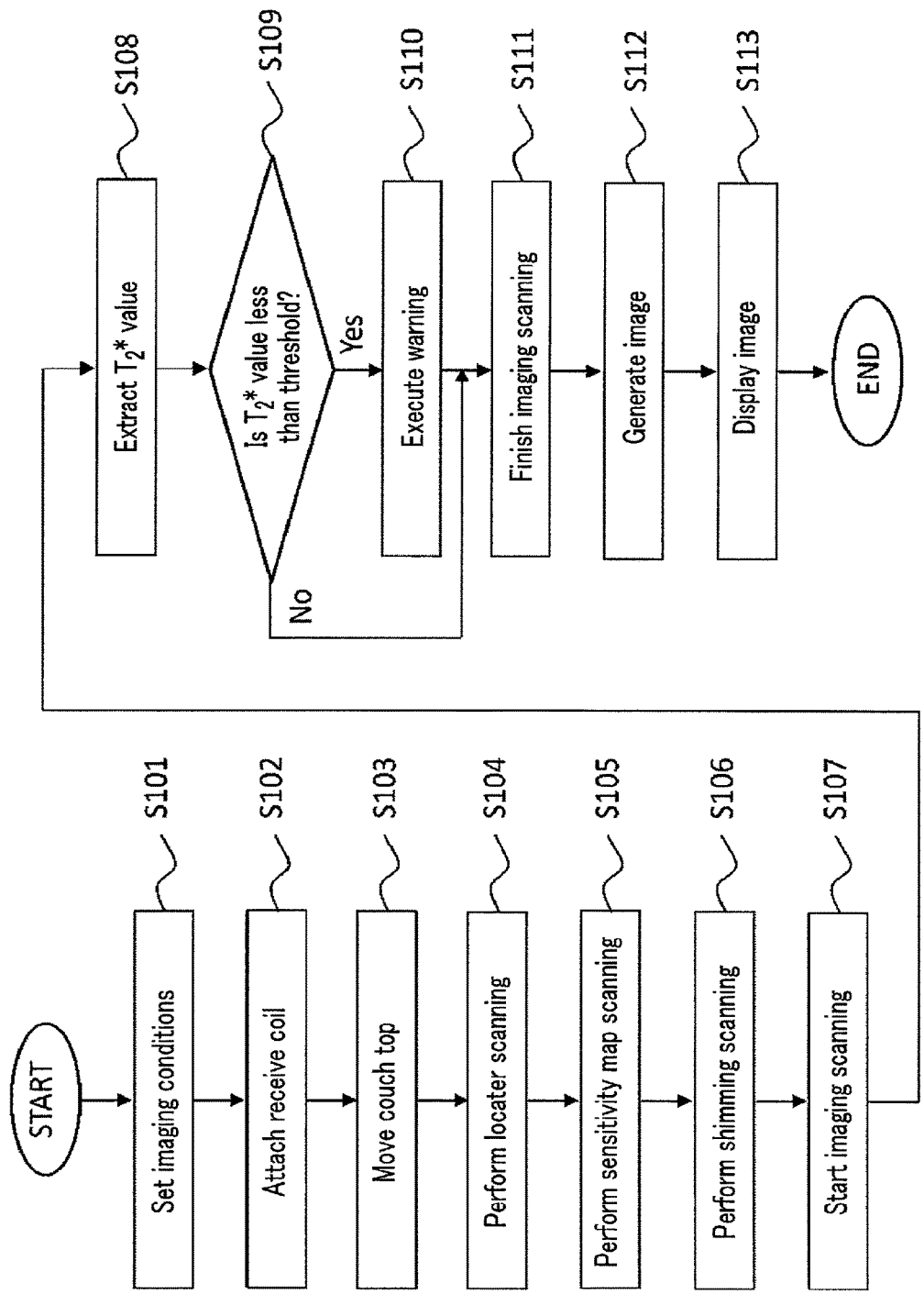
FIG. 10 is a flowchart showing an example of processing according to the embodiment.

FIG. 10 is a flowchart illustrating an example of an operation by the MRI apparatus 100 according to the present embodiment.

The processing procedure shown in the flowchart is merely an example, and if an RF pulse for obtaining $T_2^*$ value of the core member 304 can be transmitted, $T_2^*$ can be obtained at timing when any type of scanning is carried out.

First, the processing circuitry 115 that realizes the system control function 115a receives an imaging condition that is input by an operator via the input apparatus 112, and generates sequence information in accordance with the received imaging condition (step S101).

Next, the object P is placed on the couch top 105a of the couch apparatus 105, and the receive coil 109 is attached to the object P, and the receive coil 109 is electrically connected to the MRI apparatus 100 (step S102).

Next, the couch control circuitry 106 that realizes the couch control function 106a moves the couch apparatus 104 (step S103). Specifically, the couch control function 106a moves the couch top 105a to a predetermined position, thereby introducing the object P on the couch top 105a into the bore 20. Subsequently, light is emitted onto the object P from the projector (not illustrated). When the light from the projector is emitted to a target for imaging (e.g., the head), the operator designates a position of the target via the input apparatus 112. Thus, the couch control function 106a moves the couch top 105a so that the designated position is located at the center of the magnetic field.

Next, from step S104 to step S106, the sequence control circuitry 111 that realizes the sequence control function 111a executes locator scanning, sensitivity map scanning, and shimming scanning. With the locator scanning, a positioning image for setting a labeling region and an imaging region for later-described imaging scanning is collected. With the sensitivity map scanning, a reception sensitivity map of an RF coil is collected. With the shimming scanning, data for correcting uniformity in intensity of a static magnetic field is collected.

Next, imaging scanning is started by the sequence control circuitry 111 that realizes the sequence control function 111a (step S107). When imaging scanning is started, a pulse sequence like the one illustrated in FIG. 8 is executed. As shown in FIG. 8, a 90° pulse and a 180° pulse are transmitted to the object P by the transmit coil 107. At timing when no gradient magnetic field is applied after transmitting the 180° pulse from the transmit coil 107, an RF pulse to excite the core member 304 is transmitted via the transmit/receive coil 305. The RF pulse transmitted at this time corresponds to a resonance frequency of the core member 304 (i.e., a resonance frequency of the fluorine atom), not a resonance frequency of protons. Furthermore, an NMR signal of protons in the object P obtained at the time of imaging scanning is collected by the receive circuitry 110. The receive circuitry 110 digitizes the received NMR signal of protons, and transmits it to the sequence control function 111a of the sequence control circuitry 111. The sequence control function 111a has the storage circuitry 114 store the NMR signal received by the receive circuitry 110.

Upon receiving an RF pulse from the transmit/receive coil 305, the core member 304 is excited and outputs an NMR signal. Upon receiving the NMR signal, the transmit/receive coil 305 outputs the NMR signal to the receive circuitry 110. The receive circuitry 110 digitizes the NMR signal of the core member 304, and transmits the NMR signal to the sequence control function 111a of the sequence control circuitry 111. Furthermore, since a plurality of baluns 202 are placed on the cable 201 and the receive coil 109, an NMR signal is output from each core member 304 placed in each of the baluns 202. The NMR signal of the core member 304 that is output to the sequence control function 111a is stored in the storage circuitry 114.

Next, the processing circuitry 115 that realizes the data processing function 115b receives the NMR signal of the core member 304 from the storage circuitry 114, analyzes the NMR signal to extract the $T_2^*$ value (step S108), and outputs the extracted $T_2^*$ value to the determination function 115c.

Upon receiving the $T_2^*$ value, the determination function 115c compares the $T_2^*$ value with a threshold which is stored in the storage circuitry 114 in advance (step S109). If a $T_2^*$ value below the threshold is included in the plurality of $T_2^*$ values respectively corresponding to the core members 304, the determination function 115c outputs information to the warning function 115d in this regard (step S109, "Yes"). If the determination function 115c determines that a $T_2^*$ value below the threshold is not included, the processing proceeds to step S111 to finish (step S109, "No").

When the warning function 115d receives from the determination function 115c information indicating that a $T_2^*$ value below the threshold is included, the warning function 115d performs a warning display via the display apparatus 113 (step S110).

When imaging scanning is finished (step S111), the data processing function 115b generates an MR image of the object P using an NMR signal of protons in the object P stored in the storage circuitry 114 (step S112), and displays the generated MR image on the display apparatus 113.

By performing the series of processing as described above, it is possible to warn the operator when the cable 201 and the receive coil 109 get closer to the side wall of the bore 20 of the MRI apparatus 100 than a predetermined distance. Thus, the operator can know a risk of a present condition of an arrangement of the cable 201 and the receive coil 109, and can adjust the arrangement of the cable 201 and the receive coil 109 after finishing each protocol, as needed.

The above-described series of processing is merely an example, and the embodiment is not limited to the above descriptions. For example, a $T_2^*$ value may be obtained when the receive coil 109 is placed in the bore of the MRI apparatus 100 while being attached to the object P, and before the scanning by the MRI apparatus 100 is started. For example, a $T_2^*$ value may be obtained immediately after step S103 of the flowchart shown in FIG. 10 to confirm before scanning that the cable 201 and the receive coil 109 are placed at predetermined positions not too close to the side wall of the bore 20.

According to the above-described embodiment, the operator can know the positions of the receive coil 109 and the cable 201 attached to the receive coil 109 in the bore 20 of the MRI apparatus 100, and the operator is warned if the receive coil 109 and the cable 201 get too close to the side wall of the bore 20. Furthermore, using a $T_2^*$ value to detect position information of the receive coil 109 and the cable 201 allows stably performing detection of the position information in the side wall of the bore 20 where the magnetic field change significantly.

(Modification 1 of Embodiment)

In the above-described embodiment, an RF pulse corresponding to a resonance frequency of a core member 304 is transmitted to the core member 304 that outputs an NMR signal at the resonance frequency that is different from the resonance frequency of protons to obtain a $T_2^*$ value of the core member 304, and the position of the core member 304 is detected by comparing the value with a threshold related to a $T_2^*$ value stored in the storage circuitry 114 in advance; however, the embodiment is not limited to the configuration.

For example, a $T_2^*$ value (a first $T_2^*$ value) may be obtained in advance of scanning when the object P is placed in the bore 20 of the MRI apparatus 100, and the first $T_2^*$ value is compared with a $T_2^*$ value during the scanning (a second $T_2^*$ value) to detect movement of the balun 202 stored in the core member 304. In this case, if the $T_2^*$ value during the scanning becomes smaller than the $T_2^*$ value before the scanning, it is possible to detect the cable 201 or the receive coil 109 on which the balun 202 is placed getting close the side wall of the bore 20.

Figure 11:
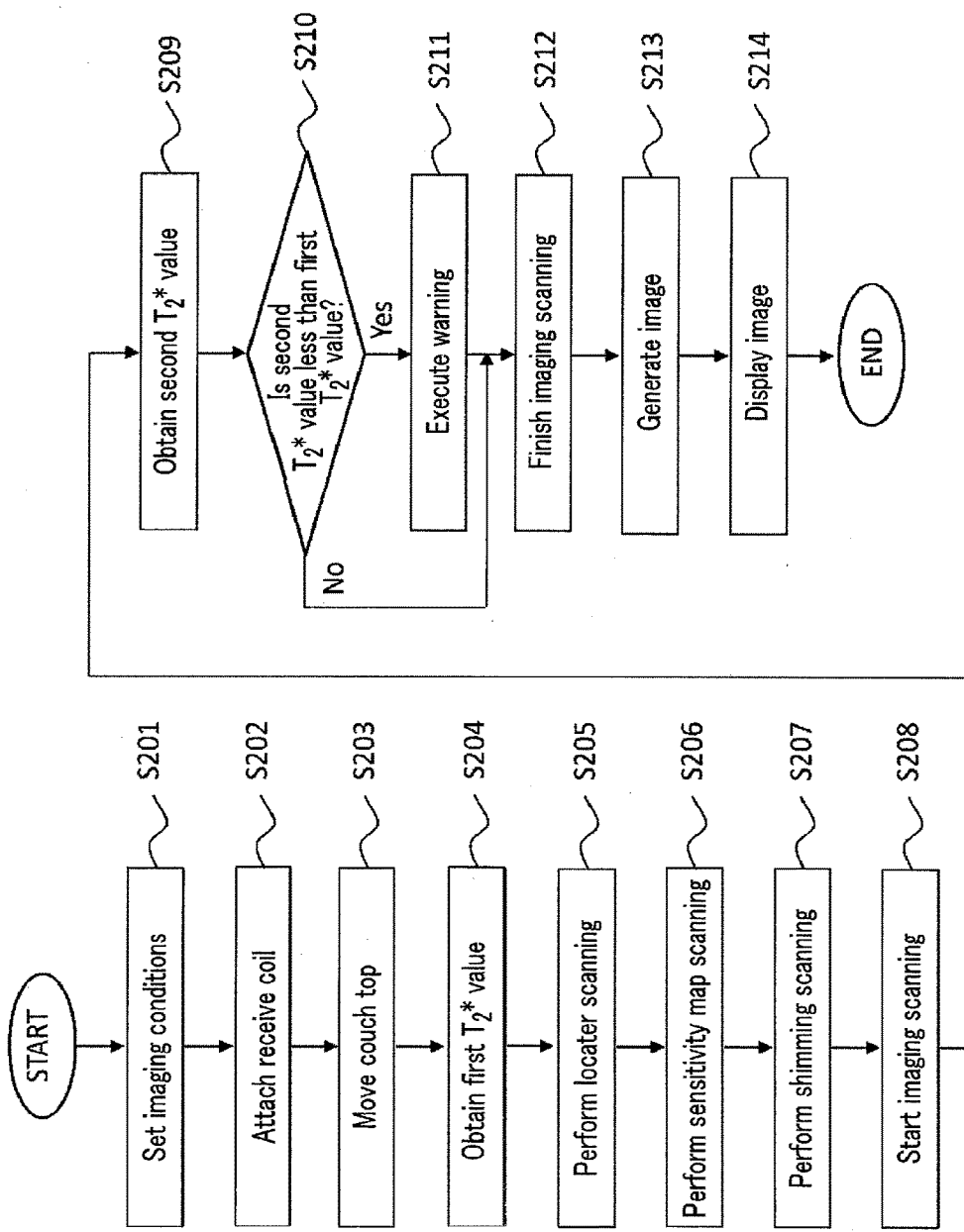
FIG. 11 is a flowchart showing an example of processing according to a modification of the embodiment.

FIG. 11 is a flowchart showing an example of processing according to the above-described modification. The description of the processing from step S201 to step 203 is omitted, as the processing is the same as the processing from step S101 to step S103 in the flowchart of the embodiment. The description of the processing from step S205 to step S208 and from step 211 to S214 are also omitted, as the processing is the same as the processing from step S104 to step 107 and from step 110 to step 113.

When the processing up to step S203 is finished, $T_2^*$ value of each core member 304 attached in the cable 201 and the receive coil 109 is obtained in step S204 before the scanning for imaging protons of the object P begins. The $T_2^*$ value (the first $T_2^*$ values) of the core member 304 obtained at this time is used for comparison with the $T_2^*$ value (the second $T_2^*$ value) which is obtained when later-described imaging scanning is performed.

The description of the processing from step S205 to step 208 is omitted as the processing is the same as the previously-described step S104 to step S107.

In step S209, a $T_2^*$ value of the core member 304 is obtained once again during imaging scanning. The method of obtaining the second $T_2^*$ value is the same as the method of obtaining the $T_2^*$ value described in the embodiment.

In step S210, the determination function 115c compares the second $T_2^*$ value obtained in step S209 with the first $T_2^*$ value obtained at the step S204. If the second $T_2^*$ value is smaller than the first $T_2^*$ value, the determination function 115c detects the balun 202 having the core member 304 that outputs the second $T_2^*$ value getting close to the bore 20 of the MRI apparatus 100 (step S210, "Yes").

The determination function 115c compares the second $T_2^*$ value with the first $T_2^*$ value, and if there is no change therebetween, or if the second $T_2^*$ value is larger than the first $T_2^*$ value, the processing proceeds to step S212.

According to the above-described modification of the embodiment, if the $T_2^*$ value becomes a smaller value compared to the $T_2^*$ value obtained before the scanning, it is possible to detect the cable 201 and the receive coil 109 including the core member 304 getting closer to the side wall of the bore 20 of the MRI apparatus 100 in comparison to when the scanning is started. At this time, content of the warning by the warning function 115d may be changed in accordance with an amount of change between the second $T_2^*$ value and the first $T_2^*$ value. For example, the warning function 115d may control the display apparatus 113 in such a manner that the size of a warning displayed on the display apparatus 113 becomes larger if the amount of change is larger than in the case of a small amount of change. The warning function 115d may control a light source corresponding to the balun 202 from which a $T_2^*$ value with a large amount of change is obtained among a plurality of baluns 202 in which the core members 304 are placed, in such a manner that the light source is lit up or flashes using an LED, etc., so that the balun 202 can be distinguished from the other baluns 202 with small amounts of change. The warning function 115d may change the flashing color of the LED, etc. in accordance with a quantity of the amount of change. For example, the warning function 115d may display the light source corresponding to the balun 202 with a large amount of change in red, the light source corresponding to the balun 202 with a small amount of change in yellow, and the light source in blue if the amount of change is 0 or if a second $T_2^*$ is larger than a $T_2^*$ value.

(Modification 2 of Embodiment)

In the above-described modification, the $T_2^*$ value obtained before the scanning and the $T_2^*$ value during the scanning are compared, and a warning is made if the $T_2^*$ value obtained during the scanning becomes smaller than the $T_2^*$ value obtained before the scanning. In the present modification, a case where the balun 202 is moved in a region with low magnetic field uniformity in the bore 20 will be explained.

Figure 12:
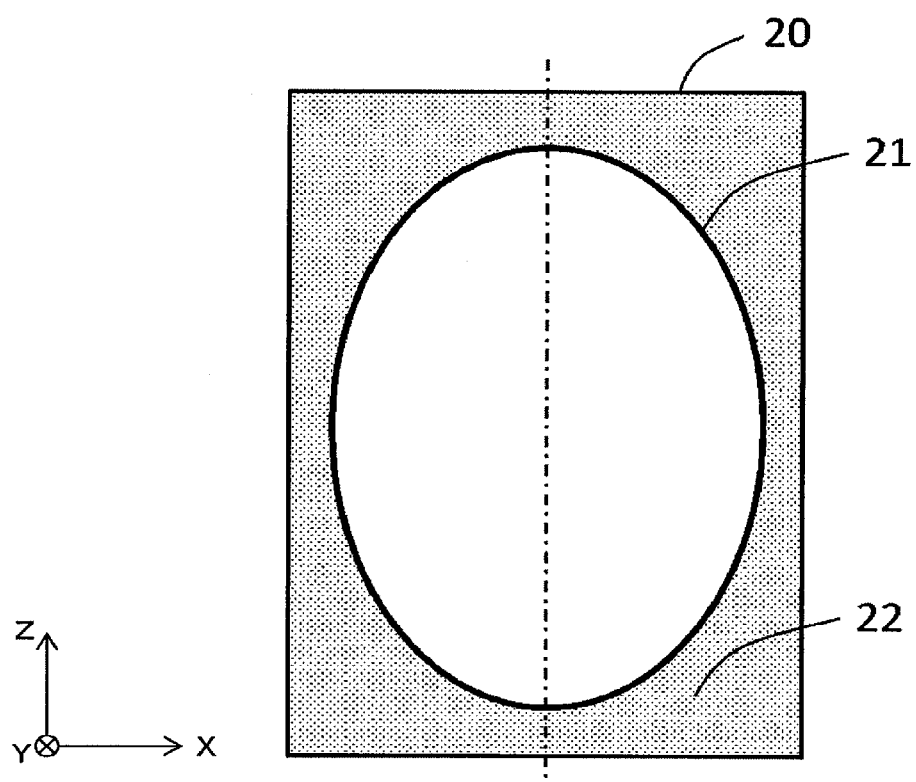
FIG. 12 is a drawing showing a distribution of a magnetic field in the bore of the magnetic resonance imaging apparatus according to the embodiment.

FIG. 12 is a drawing showing an example of distribution of magnetic field uniformity in the bore 20. FIG. 12 is a top view of the bore 20 seen from above with respect to the floor.

As shown in FIG. 12, there are a region 21 with high magnetic field uniformity and a region 22 with low magnetic field uniformity in the bore 20. It can be assumed that the balun 202 having the core member 304 may move in the region 22 with low magnetic uniformity in FIG. 12, and get close to the side wall of the bore 20. In this case, since the core member 304 moves only in the region with low magnetic field uniformity, the core member 304 continues outputting a value smaller than a $T_2^*$ value obtained in the region with high magnetic field uniformity. Furthermore, since the $T_2^*$ value would not exceed the predetermined threshold which is explained in the previously-described embodiment, the balun 202 getting close to the side wall of the bore 20 cannot be detected in the region 22 with low magnetic field uniformity with the above-described configuration of the embodiment.

For this reason, if the balun. 202 exists in the region with low magnetic field uniformity while the object P is being inserted in the bore 20, the $T_2^*$ value of the core member 304 obtained during examination changes with time, and upon the time variation of the $T_2^*$ value exceeding a predetermined value, the processing circuitry 115 that realizes the warning function 115d may make a warning. Thus, it is possible to make a warning when the balun 202 gets close to the side wall of the bore 20 in the region 22 having low magnetic field uniformity.

Specifically, the second transmit coil transmits a second RF pulse to the above-described substance for several times at different transmission times under the control by the sequence control circuitry 111. The second receive coil receives a plurality of second NMR signals in accordance with the transmission times. The storage circuitry 114 stores the predetermined value.

The processing circuitry 115 that realizes the data processing function 115b calculates a plurality of $T_2^*$ values respectively corresponding to the plurality of second NMR signals. Subsequently, the processing circuitry 115 that realizes the data processing function 115b calculates a time variation of a $T_2^*$ value based on the calculated plurality of $T_2^*$ values. Upon the calculated time variation exceeding the predetermined value, the processing circuitry 115 that realizes the determination function 115c outputs a warning to the display apparatus 113.

In the previously-described embodiment, it is explained that the balun 202 is attached to the cable 201 and the receive coil 109; however, it is theoretically possible to carry out the embodiment without using a balun. For example, by directly attaching the core member 304 which emits an NMR signal to the cable 201 and the receive coil 109, not inside of the balun case 303, the processing circuitry 115 that realizes the determination function 115c can detect the cable 201 and the receive coil 109 getting close to the side wall of the bore 20 of the MRI apparatus 100.

In the previously-described embodiment, it is explained that a warning is made by the warning function 115d when the balun 202 gets close to the side wall of the bore 20 of the MRI apparatus 100; however, the warning function 115d may display only a $T_2^*$ value of the core member 304 corresponding to the balun 202 on the display apparatus 113. In this case, the operator can know a position of the balun 202 by reading a quantity of the $T_2^*$ value displayed on the display apparatus 113.

(Modification 3 of Embodiment)

According to the foregoing embodiment, Modification 1, and Modification 2, a determination and a warning, etc. are made using a $T_2^*$ value of the substance; however, in the present modification, a determination and a warning, etc. are made using intensity of a second NMR signal from the substance including a second nuclide species (fluorine, etc.), such as a fluorine compound, etc.

The processing circuitry 115 that realizes the data processing function 115b has a band pass filter that allows a predetermined frequency band to pass. The processing circuitry 115 extracts a signal included in a predetermined frequency band in the second NMR signal by applying a band pass filter to the second NMR signal. Herein, a predetermined frequency band has, for example, a resonance frequency of a second nuclide species as a central frequency. It is desirable if a resonance frequency related to the first nuclide species (protons, etc.) is not included in this frequency band. As a consequence, a signal which has passed a predetermined frequency band becomes mainly a signal in the vicinity of a resonance frequency in the second nuclide species. For this reason, the intensity of a signal that has passed a predetermined frequency band becomes a value which reflects a total number of the second nuclide species included in the core member 304, i.e., the substance, and a static magnetic field $B_0$ at which the substance is located.

The processing circuitry 115 that realizes the determination function 115c determines whether or not the intensity of the second NMR signal that has passed a predetermined frequency band is smaller than a reference value. The reference value is stored in the storage circuitry 114 and related to the intensity of the second NMR signal that has passed a predetermined frequency band based on a position of the substance in the vicinity of the balun 202 in the imaging space.

The processing circuitry 115 sets the intensity of a signal included in the above frequency band in the second NMR signal as a reference value, the intencity being obtained by transmitting a second RF pulse from the second transmit coil to the substance upon the balun 202 being apart from the first transmit coil 107 in the imaging space.

The processing circuitry 115 that realizes the warning function 115d outputs a warning upon the intensity of a signal included in the above frequency band in the second NMR signal being smaller than a reference value.

According to the present modification, the following effect can be achieved in addition to the effects achieved by the foregoing embodiment, Modification 1, and Modification 2.

According to the magnetic resonance imaging apparatus 100 of the present modification, a warning can be output if the intensity of a signal included in a predetermined frequency band in the second NMR signals is smaller than a reference value. Further according to the present magnetic resonance imaging apparatus 100, it is possible to set the intensity in a frequency band as the reference value, the intencity being obtained by transmitting a second RF pulse from a second transmit coil to the substance upon the balun 202 in the imaging space being apart from a first transmit coil 107. Thus, according to the present magnetic resonance imaging apparatus 100, throughput for outputting a warning can be improved as there is no need of calculating a $T_2^*$ value based on a second NMR signal.

In the foregoing embodiment and modifications, the transmit coil 107 and the receive coil 109 of the MRI apparatus 100 are separately configured; however, a transmit/receive coil having the functions of both of the transmit coil 107 and the receive coil 109 may be used. In this case, the transmit/receive coil has both of a function of transmitting an RF pulse corresponding to a resonance frequency of protons and a function of obtaining an NMR signal from protons.

The operation of the constituent elements explained as "units" in the previously-described embodiment may be realized by hardware, software, or a combination thereof.

It should be noted that the expression "processor" used in the above explanation means circuitry, such as a CPU (Central Processing Unit), GPU (Graphics Processing Unit), Application Specific Integrated Circuit (ASIC), a programmable logic device (for example, Simple Programmable Logic Device (SPUD), Complex Programmable Logic Device (CPLD), and Field Programmable Gate Array (FPGA)), etc. The processor realizes its function by reading and executing a program stored in the storage circuitry 114. Instead of storing a program on the storage circuitry 114, the program may be directly integrated into the circuitry of the processor. In this case, the function is realized by reading and executing the program integrated into the circuitry. Each processor of the present embodiment is not limited to a case where each processor is configured as single circuitry; a plurality of independent circuits may be combined into one processor to realize the function of the processor. Furthermore, a plurality of constituent elements shown in FIG. 1 may be integrated into one processor to realize the function.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

The invention claimed is:

1. A magnetic resonance imaging apparatus comprising:
    a first transmit coil configured to transmit a first RF pulse corresponding to a resonance frequency of a first nuclide species in an object placed in an imaging space;
    a first receive coil configured to receive a first NMR signal of the first nuclide species;
    a cable connected to the first receive coil;
    a balun attached to at least one of the cable and the first receive coil;
    a substance attached to at least one of the balun and vicinity of the balun, the substance including a second nuclide species having a resonance frequency different from the resonance frequency of the first nuclide species;
    a second transmit coil configured to transmit a second RF pulse corresponding to a resonance frequency of the second nuclide species; and a second receive coil configured to receive a second NMR signal of the second nuclide species in the substance.

2. The magnetic resonance imaging apparatus according to claim 1, further comprising processing circuitry configured to:
calculate a $T_2^*$ value corresponding to the second nuclide species based on the second NMR signal, and
output a warning based on the $T_2^*$ value,
wherein $T_2^*$ corresponds to a time until a free induction signal attenuates to 1/e by an influence of a non-uniform static magnetic field.

3. The magnetic resonance imaging apparatus according to claim 2, wherein the processing circuitry is configured to output a warning upon the $T_2^*$ value being smaller than a threshold.

4. The magnetic resonance imaging apparatus according to claim 3, wherein
the first transmit coil is a whole-body coil covering the imaging space,
the processing circuitry is configured to set a $T_2^*$ value as the threshold, and
the $T_2^*$ value is calculated based on the second NMR signal obtained by transmitting the second RF pulse from the second transmit coil to the substance upon the balun being apart from the first coil in the imaging space.

5. The magnetic resonance imaging apparatus according to claim 3, wherein the processing circuitry is configured to:
set a plurality of values as the threshold, the plurality of values being corresponding to a plurality of positions in the imaging space,
determine a position of the balun in the imaging space by using the plurality of values and the $T_2^*$ value smaller than the threshold upon the $T_2^*$ value being smaller than the threshold, and
output information in accordance with the position of the balun as the warning.

6. The magnetic resonance imaging apparatus according to claim 2, further comprising a light source provided in a position corresponding to the balun,
wherein the light source is configured to lighten or flash in accordance with the warning.

7. The magnetic resonance imaging apparatus according to claim 2, wherein the processing circuitry is configured to cause a speaker to output sound corresponding to the warning.

8. The magnetic resonance imaging apparatus according to claim 1, wherein
the second receive coil and the second transmit coil include three individual loop coils, and
the three individual loops are orthogonal to each other.

9. The magnetic resonance imaging apparatus according to claim 1, wherein
the second transmit coil transmits the second RF pulse to the substance in a period during which no gradient magnetic field is applied to the substance, and
the second receive coil receives the second NMR signal during the period.

10. The magnetic resonance imaging apparatus according to claim 1, wherein the substance includes a fluorine compound.

11. The magnetic resonance imaging apparatus according to claim 1, wherein
the second transmit coil transmits the second RF pulse to the substance for several times at different transmission times,
the second receive coil receives a plurality of second NMR signals in accordance with the transmission times,
the apparatus further comprises processing circuitry configured to output a warning upon a time variation of a $T_2^*$ value exceeding a predetermined value,
the time variation of the $T_2^*$ value is calculated by using the plurality of the second NMR signals, and
$T_2^*$ corresponds to a time until a free induction signal attenuates to 1/e by an influence of a non-uniform static magnetic field.

12. The magnetic resonance imaging apparatus according to claim 1, further comprising processing circuitry configured to output a warning based on intensity of a signal included in a predetermined frequency band in the second NMR signal.

13. The magnetic resonance imaging apparatus according to claim 12, wherein the processing circuitry is configured to output a warning upon the intensity being smaller than a reference value.

14. The magnetic resonance imaging apparatus according to claim 13, wherein
the first transmit coil is a whole-body coil covering the imaging space,
the processing circuitry is configured to set the intensity in the frequency band as the reference value, and
the intensity is obtained by transmitting the second RF pulse from the second transmit coil to the substance upon the balun being apart from the first transmit coil in the imaging space.

* * * * *